(12) United States Patent
Ganter et al.

(10) Patent No.: US 10,064,439 B2
(45) Date of Patent: Sep. 4, 2018

(54) TEMPERATURE REGULATORY FABRICS, SYSTEMS AND APPLICATIONS

(71) Applicant: ITS KOOL, LLC, Lafayette, CO (US)

(72) Inventors: William A. Ganter, Boulder, CO (US); Anthony Peter Arnold, Lafayette, CO (US); Sean Ortiz, Boulder, CO (US)

(73) Assignee: IT'S KOOL, LLC, Lafayette, CO (US)

( * ) Notice: Subject to any disclaimer, the term of this patent is extended or adjusted under 35 U.S.C. 154(b) by 985 days.

(21) Appl. No.: 14/472,342

(22) Filed: Aug. 28, 2014

(65) Prior Publication Data

US 2015/0208738 A1    Jul. 30, 2015

Related U.S. Application Data

(60) Provisional application No. 61/931,611, filed on Jan. 25, 2014.

(51) Int. Cl.
*A61F 7/08* (2006.01)
*B32B 5/22* (2006.01)
(Continued)

(52) U.S. Cl.
CPC ......... *A41D 13/005* (2013.01); *A47G 9/0215* (2013.01); *B32B 5/26* (2013.01); *B32B 7/12* (2013.01); *H01L 35/30* (2013.01); *B32B 2250/02* (2013.01); *B32B 2250/20* (2013.01); *B32B 2255/02* (2013.01); *B32B 2437/00* (2013.01); *B32B 2479/00* (2013.01); *B32B 2535/00* (2013.01); *F25B 21/04* (2013.01)

(58) Field of Classification Search
None
See application file for complete search history.

(56) References Cited

U.S. PATENT DOCUMENTS 5,032,450 A    7/1991  Rechlicz
7,256,695 B2 *  8/2007  Hamel ................. A61F 2/4657
                                                340/572.1
(Continued)

FOREIGN PATENT DOCUMENTS

GB      2526543 A  * 12/2015  ............... G01N 3/02
KR   20090056016 A  *  6/2009

OTHER PUBLICATIONS

PCT/US15/12106 International Search Report and the Written Opinion of the International Searching Authority dated Mar. 17, 2015.

(Continued)

*Primary Examiner* — Joseph M Pelham
(74) *Attorney, Agent, or Firm* — Glenn H. Lenzen; Dietze and Davis, P.C.

(57) ABSTRACT

A temperature regulating fabric formed from micro porous inner and outer layers of fabric laminated around a plurality of totally independent TE devices together with antennae and energy harvesting electronics within, all deposited upon a flexible substrate to form a thermal module. These completely independent thermal modules are positioned at preselected locations intermediate the laminated inner and outer fabric layers to form the temperature regulating fabric, which is used to construct temperature regulating devices powered by harvested ambient RF energy for both cooling and warming applications.

36 Claims, 4 Drawing Sheets

(51) Int. Cl.
*A61N 1/02* (2006.01)
*B32B 27/18* (2006.01)
*A41D 13/005* (2006.01)
*H01L 35/30* (2006.01)
*B32B 5/26* (2006.01)
*A47G 9/02* (2006.01)
*B32B 7/12* (2006.01)
*F25B 21/04* (2006.01)

(56) References Cited

U.S. PATENT DOCUMENTS

| | | | | |
|---|---|---|---|---|
| 7,268,517 B2* | 9/2007 | Rahmel | ............... | H02J 17/00 320/101 |
| 2006/0009251 A1 | 1/2006 | Noda | | |
| 2006/0280948 A1* | 12/2006 | Moreshead | ............ | B32B 5/024 428/411.1 |
| 2006/0281435 A1 | 12/2006 | Shearer | | |
| 2007/0199137 A1* | 8/2007 | Numes Ramos De Carvalho | ...... | A41D 1/002 2/458 |
| 2007/0276270 A1* | 11/2007 | Tran | ................ | A61B 5/0022 600/508 |
| 2008/0058742 A1* | 3/2008 | Ales | ................ | A61F 13/42 604/361 |
| 2008/0109941 A1* | 5/2008 | Moreshead | ............ | B32B 7/02 2/243.1 |
| 2011/0127248 A1* | 6/2011 | Moreshead | .......... | D03D 1/0076 219/209 |
| 2011/0130813 A1 | 6/2011 | Moreshead | | |
| 2013/0244121 A1 | 9/2013 | Gogotsi | | |
| 2015/0208738 A1 | 7/2015 | Ganter | | |
| 2016/0178251 A1* | 6/2016 | Johnson | ................ | A61F 7/007 62/3.5 |
| 2017/0209301 A1* | 7/2017 | DeSeve | ................ | A61F 7/007 |

OTHER PUBLICATIONS

PCT/US15/12106 International Preliminary Report on Patentability dated Jul. 26, 2016.
PCT/US15/12106 Written Opinion of the International Searching Authority dated Mar. 17, 2015.

* cited by examiner

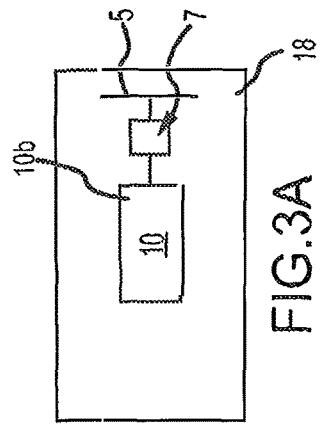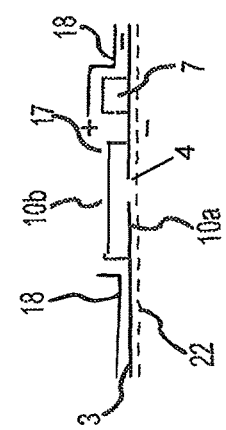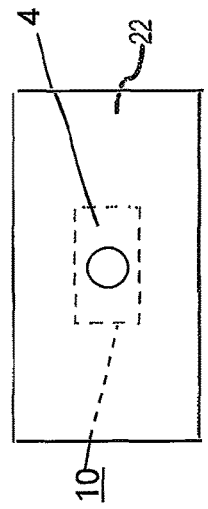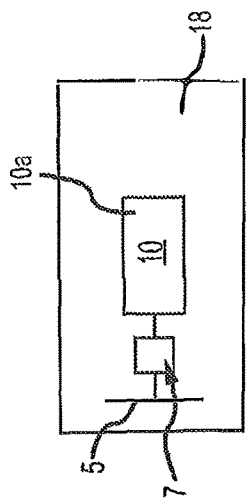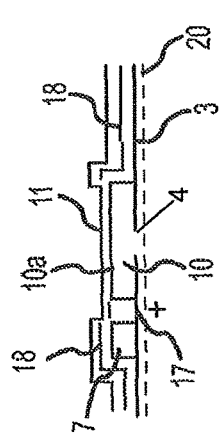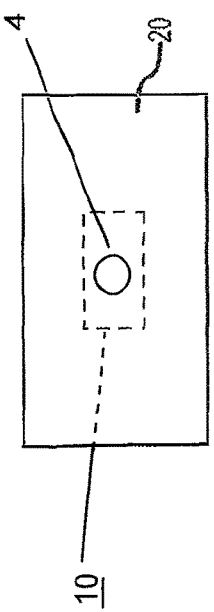

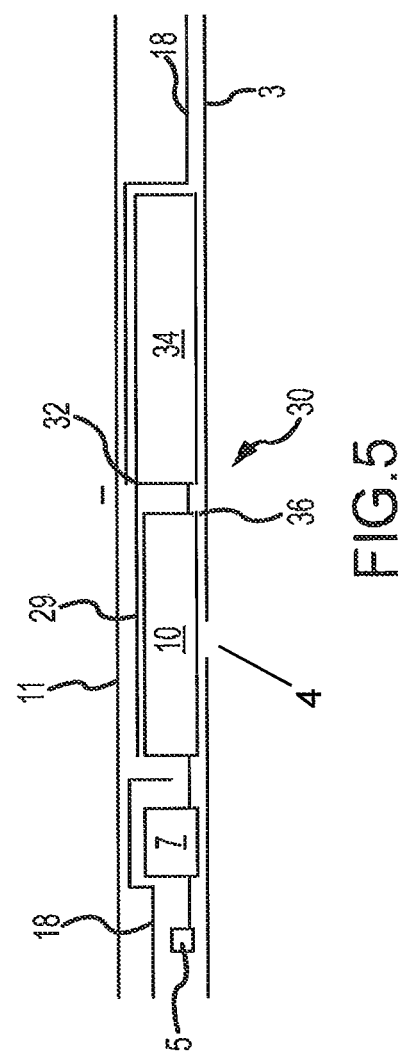

TEMPERATURE REGULATORY FABRICS, SYSTEMS AND APPLICATIONS

PRIORITY TO RELATED PATENT APPLICATIONS

This application claims priority to U.S. Provisional Patent Application Ser. No. 61/931,611 filed Jan. 25, 2014, the subject matter of which is incorporated herein in its entirety by reference.

FIELD OF THE INVENTION

The present invention relates generally to temperature regulation and personal comfort. More specifically, the present invention relates to temperature regulation electronics integrated into fabrics, which may be used in various systems and applications to control temperatures.

BACKGROUND OF THE INVENTION

Human beings can be too cold or too hot in everyday activities, including work, athletics, general recreational endeavors and sleep. Likewise, animals, whether pets, agricultural animals, sporting animals such as race and show horses, and animals in zoos and reserves may be exposed to temperature extremes or veterinary treatments which require temperature control. Moreover, certain physical conditions such as insomnia, migraine headaches, hot flashes and night sweats may be treated by the use of temperature regulating methods, devices and systems to apply hypothermal therapy to the skin over certain areas of the body such as the forehead and/or the neck. The present invention offers a novel system and means for providing control of and some level of relief from uncomfortable temperature conditions and the treatment of certain medical conditions.

An aspect of the present invention is the harvesting of radio frequency (RF) radiation into DC power to power thermoelectric (TE) devices for temperature regulation. For ease of description, the term "TE" as used herein shall mean "thermoelectric", and the terms may be used interchangeably. The totally independent electronics are deposited on flexible substrates, which are placed and laminated between an inner and outer fabric layer. The temperature regulation, regulating or regulatory fabrics have a number of useful applications. A primary application is wearable garments. The fabrics may also be used in the manufacture of bedding such as sheets, pillowcases, and blankets; seat pads, seat backs, cushions and other such articles to increase the comfort of the user. The fabrics of the current invention can be configured for either cooling or warming applications by the selection of the plus or minus DC current direction to the TE devices.

Other related devices in the prior art were deployed with alternative technologies, and in contrast to the present invention, all of these prior art devices were wired to batteries for their DC power.

One prior art device is disclosed in U.S. Pat. No. 5,970,718 issued to Arnold, a co-inventor of the present invention, on Oct. 26, 1999, for Personal Heat Control. That patent discloses the application of direct cooling or warming to specific locations on the human body where the blood vessels are close to the surface of the skin. The cooling is produced by a TE device in contact with the skin and contained in headbands or wristbands and the like.

A second apparatus by the same co-inventor is disclosed in U.S. Pat. No. 8,087,254 B2 issued Jan. 3, 2012, for Personal Heat Control Device and Method. That patent discloses a method of extracting excess personal heat from the inside of a helmet or mask through the use of heat pipe thermal transfer technology. The above described devices in both Arnold disclosures are limited to very specific points on the body and involve apparatus which are contained in helmets or other enclosures which must be worn by an individual to receive the benefit of the body temperature control. However, the novel structure of the electronic configurations of the instant invention uniquely extends the application of heat transfer technology to temperature regulation in general and to the temperature regulating applications for the fabrics herein disclosed.

Yet another temperature regulating approach is disclosed in WIPO Patent Application Publication No. WO2012115933 A2 published by Finefrock et al. on Aug. 30, 2012, for Flexible Polymer-Based Thermoelectric Materials and Fabrics Incorporating the Same. This publication describes the incorporation of battery powered flexible polymer-based thermoelectric materials as a film coated onto fabrics for purpose of cooling a wearer. Here the polymer film contains conductive nanowires that deliver the TE effect.

Other efforts at solving the aforementioned temperature regulation problems have employed phase change materials, ice packs, fans and sprays, among others; none of which have achieved the intended combination of temperature regulation, comfort and convenience of use. Accordingly, a need has arisen for an improved personal temperature regulation system which provides reliable and convenient temperature control features for a user without requiring cumbersome and breakable wiring, battery, ice packs, fans and the like.

SUMMARY OF THE INVENTION

The temperature regulating fabrics disclosed herein are formed from micro porous inner and outer layers of fabric laminated around a plurality of totally independent TE devices together with antennae and energy harvesting electronics within, all deposited upon a flexible substrate, in combination hereinafter referred to simply as a thermal module. These completely independent thermal modules are positioned at preselected locations intermediate the laminated inner and outer fabric layers, thereby creating the temperature regulating fabrics of the present invention.

In one embodiment, the present invention provides an internally powered lightweight personal temperature regulation system integrated into fabrics.

In an embodiment, the present invention also provides temperature regulatory or regulating fabrics which include a plurality of totally independent thermal modules distributed throughout that are powered by a plurality of radio frequency (RF) antennae structured and arranged to harvest RF radiation and rectify it into DC power.

In one embodiment, the present invention includes wearable fabric garments for either warming or cooling a wearer.

Wearable fabric garments that are reversible are included in an embodiment in order to selectively cool a wearer's skin or to selectively warm a wearer's skin.

In another embodiment, an internally powered lightweight temperature regulatory or regulation system is integrated into fabrics used in the manufacture of bedding materials, seat pads, cushions and other articles for human comfort.

In an embodiment, temperature regulatory wraps and blankets and coverings are provided for medical and veterinary treatment applications.

Yet another embodiment includes fabrics for use in food and beverage preservation and refrigeration applications.

In one embodiment, an internally powered lightweight temperature regulation system is provided which is free from battery power sources and associated wire connections, thereby having enhanced comfort, convenience, flexibility and reliability.

Another embodiment includes an internally powered lightweight temperature regulation system that is DC powered by a dedicated solar array that is separate and independent from the power grid and where this DC operates RF oscillators directed at the temperature regulating fabrics.

In one embodiment, the present invention includes an internally powered lightweight temperature regulation system that will reduce demand for grid power consumption for air conditioning and central heating applications.

These and other features of the present invention will be apparent from the accompanying drawings, description of the invention and appended claims as herein set forth.

BRIEF DESCRIPTION OF THE DRAWINGS

FIGS. 2(A)-(C) are a top plan, side elevation and bottom plan views of a flexible substrate with the electronic components of a thermal module for a cooling application showing portions thereof in greater detail.

FIGS. 3(A)-(C) are a top plan, side elevation and bottom plan views of a flexible substrate with the electronic components of a thermal module for a warming application showing portions thereof in greater detail.

FIG. 5 is a side elevation view of a flexible substrate with the electronic components of a thermal module that further incorporates a thermocouple to convert waste heat into additional DC in accordance with an embodiment.

DESCRIPTION OF THE INVENTION

It should be noted that the present description is by way of illustration only, and that the concepts and examples presented herein are not limited to use or application with any fabric or single wearable temperature relief garment, wrap, apparatus, or system. Hence, while the details of the temperature regulating fabric system described herein are for the convenience of illustration and explanation with respect to the exemplary embodiments, the principles disclosed may be applied to other types of fabrics fashioned into wearable temperature relief garments, wraps, and articles designed for comfort via temperature control without departing from the scope of the present invention. For purposes of describing the structure and operation of the various aspects of the instant invention, the terms "regulation", "regulatory" and "regulating" will be used interchangeably herein.

As will be described in greater detail below, since the independent thermal modules are locally powered by antennae, no wire connections to a battery are needed or present throughout a fabric. These completely self-contained thermal modules add both flexibility and reliability to a fabric and articles constructed therefrom. If some of these independent thermal modules become damaged, the remainder will still function normally. This is a major advantage of the present invention. As long as some radiation is being received in at least one antenna of a thermal module, then that independent thermal module will electrically drive heat transfer from the cool side of a TE device to its warm side. The quantity of heat transferred in a thermal module is directly proportional to the DC power being locally delivered from its antennae. While these antennae always harvest ambient radiation, they can also harvest additional radiation from external nearby local wireless RF oscillators directed at a fabric when this is useful to increase its thermal effects.

Figure 1:
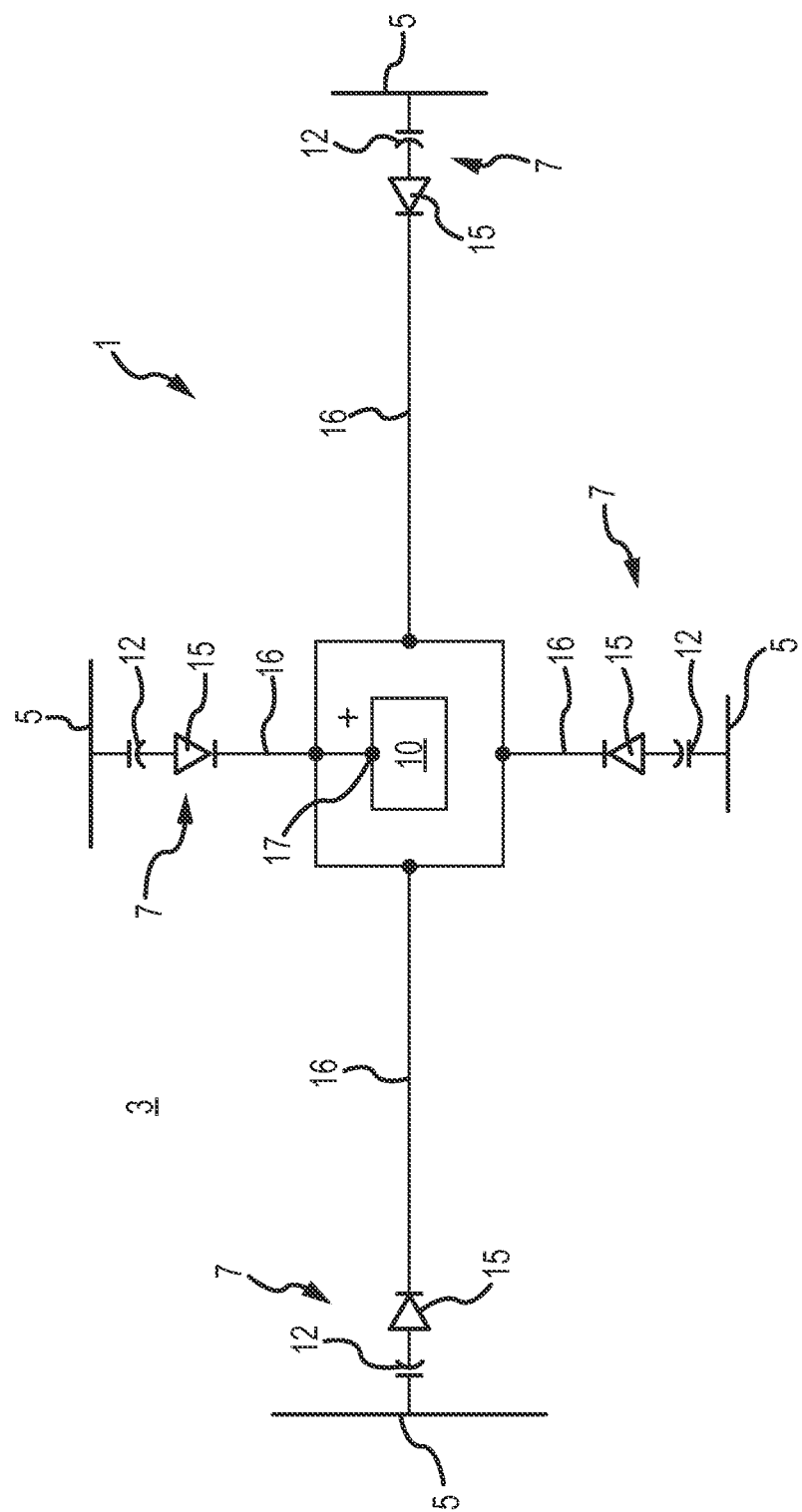
FIG. 1 is a schematic diagram of the electronic components that comprise an independent thermal module that harvests RF radiation in accordance with an embodiment of the present invention.

Thermal Module Design:

Referring now to FIG. 1, by way of illustration and not of limitation, in accordance with the present invention, the layout of an exemplary thermal module indicated generally at 1 is shown in greater detail. The electronics are deposited on a thin flexible substrate 3. A plurality of RF antennae 5 and electronics associated with each antenna (illustrated generally at 7) are adapted to harvest and rectify RF radiation into DC power required to operate a TE device 10. The electronics 7 associated with each RF antenna 5 includes a capacitor 12 and one diode 15 for half wave rectification of antenna-received RF alternating current (AC) waveforms into a DC current. Full wave rectification requires four diodes (not shown) in a circuit configuration commonly known in the art. Each antenna 5 and its associated circuit elements 7 (capacitor 12 and diode 15), are connected by deposited wires 16 to each other and to the anode 17 (indicated by the positive (+) sign) of the TE device 10.

In the embodiment of FIG. 1, for purposes of illustration, four antennae are shown. However, it is to be understood that the scope of the instant invention is not so limited, and any number of RF antennae may be incorporated into a single circuit module, limited only by layout geometry; the antennae being adapted to harvest ambient radiation over a wide range of frequency bands to provide DC power to the TE devices.

Thermal Module Fabrication:

The TE devices are each aligned precisely on the substrate by means of registration references, which, by way of illustration and not of limitation, may be in the form of holes, optical marks or the like (not shown). As discussed in greater detail below, an opening 4 is provided in the substrate beneath the TE device for heat transfer. Additional optional openings in the substrate could aid in flexion. Holes in the substrate could be opened by common photo etching or by laser burn, among other methods. The TE device can be placed on the substrate with either the anode or cathode side down in accordance with the intended application.

Without limiting the scope of the present invention, a number of process variations are contemplated thereby for depositing the RF antennae 5 and electronics 7, and wiring these components to the TE device 10 on the flexible substrate 3. Such processes could include thin film deposition, plating, or printing processes such as ink-jet, 3-D or rolled-on pattern layers, or combinations thereof. The sizes of the substrates may be analogous to the sizes of present-day semiconductor wafers, each of which may contain a large number of identical thermal modules, which are diced prior to placement on a fabric. The process and substrate configurations contemplated herein are readily adaptable for extensive automation and high-volume, cost-effective production.

As shown in the embodiment of FIG. 1, the electrical pathway in the thermal modules of the current invention is from each of the antenna 5 to capacitor 12, then to diode 15, then via conductor 16 to the anode 17 (the cool side) of the TE device 10 through the various layers of the TE device as described below to the cathode or the warm side (not shown) and back to the antenna ground, thus completing the electrical circuit. The multiple antennae incorporated into each independent thermal module 1 after rectification into DC current, are added together. The multiple antennae and their associated electronic elements are tuned for different RF bands via capacitor value and antenna length or shape. It should be appreciated that while linear antennas are depicted in FIG. 1 for simplicity, many other configurations are within the scope of this invention, and in particular antenna designs that are in very compact configurations and ones that are robust to the polarization orientation of RF waves, rather than aligning for just horizontal or vertical polarized transmissions, among other antenna designs.

Referring now to FIGS. 2(A)-(C), elements of the flexible electronics of the embodiment of FIG. 1 are shown positioned in greater detail on the substrate 3 in a cooling application. In many locations of a temperature regulating fabric, the construction will be in the form of a fabric to fabric lamination (not shown), but in the locations of each independent thermal module, the lamination will be the outer fabric to the inner fabric with the substrate along with the thermal module comprising the TE device and the energy harvesting electronics in between the fabrics. For purposes of clarity, the laminated fabric layers are not shown in FIGS. 2(A)-(C) or in FIGS. 3(A)-(C).

The surface area of the substrate containing the antennae and DC rectification electronic components may optionally be coated with a heat insulating layer to impede TE conducted heat from flowing back through the fabric towards its source. Moreover, when the thermal module outer surfaces are treated with insulating layers, then the entire upper and lower surface areas of the substrate may also be optionally coated with a thermally conductive heat-spreading layer to enlarge the thermal contact area with the skin and with the ambient air.

Accordingly, an optional insulation layer 18 is shown in the top or air surface view of the elements in FIG. 2(A) and in FIG. 2(B) in sectional view. This optional deposited layer would extend around but not cover the TE device 10, but would cover the entire remainder of the thermal module substrate including covering over the antennae and rectification electronics that are deposited on the substrate. The purpose of insulating layer 18 would be to help reduce heat return flows from the hot TE device air surface back through the substrate and inner fabric to the skin that is being cooled. An optional heat dissipation layer 11 can be deposited over the entire substrate on top of the insulating layer 18 and directly upon the hot surface 10a of the TE device 10 that was not covered by the insulating layer 18 and which is exposed to the air. Since a useful heat dissipating material 11 would likely be electrically conductive, it could only be deposited over an insulating layer 18; else it could possibly short out the energy harvesting electronics on the substrate.

In a similar manner, FIG. 2(C), which is a bottom or skin surface view of the TE module of FIGS. 2(A) and 2(B), depicts an optional heat collector pad or cool conduction layer 20 which could be deposited on the cool skin underside of the thermal module substrate; the surface that does not contain the energy harvesting electronics. This cool conduction layer 20 under the substrate, illustrated by the dotted line 20 in FIG. 2(B), is located on top of the inner fabric, thereby effectively enlarging the area of the user's skin that could transfer heat to the cooling side of the TE device 10.

FIGS. 3(A)-(C) show a reverse configuration of the system structured and arranged to warm a user instead of cooling him or her. The FIG. 3 configuration differs from FIG. 2 in that the rectified positive DC current for a warming fabric connects to the anode 17 on the top air surface side 10b of the TE device 10. The layers within the TE device 10 are in reverse of a cooling configuration, that is, upside down. The antennae and the energy harvesting electronics however are deposited on the top of the substrate 3, as in the cooling configurations of FIG. 2(A)-(C).

An insulating layer 18 could optionally be applied to the top air surface of substrate 3 as shown in FIG. 3(B). This optional layer 18 would be deposited so as not to cover the top cool surface of TE device 10. This layer 18 would help to retain the heat that was transferred to the warm skin side 10a of the TE device 10 by preventing it from escaping back through the substrate 3 into the cooler air. FIGS. 3(A) and 3(C) depict an optional warm conduction layer 22 that could be deposited under the substrate and in direct contact through the hole 4 in the substrate 3 with the warm surface of TE device 10 for spreading the heat over a larger area of the skin.

At these active locations, a few degrees of temperature effect will be felt on the skin of a wearer, but the wearer will simply experience the ambient skin temperature in the fabric to fabric lamination locations. It should also be appreciated that thermal modules may be densely located or very sparsely located in fabric sections of a wearable garment, for some designed purpose. The sparse locations will mostly be simply fabric to fabric laminations.

RF Energy Harvesting:

Wireless cellular and Wi-Fi networks and other RF energy transmissions radiate through the air in most locations and are particularly strong in and around urban population centers. This ambient RF energy is a viable source of usable energy that may be harvested economically by the plurality of antennae 5 over various frequency bands. The received transmissions are rectified by the electronics 7 (the capacitor 12 and diode(s) 15) electrically coupled thereto into the DC current required to power the TE devices 10 and are electrically coupled thereto as hereinbelow described.

Frequency bands that may be very active include cellular transmission bands in 700 and 800 MHz, and in 1700 through 2300 MHz, and 2500 through 2600 MHz, and the Wi-Fi bands in 2.4 and 5 GHz. The 3500 MHz band is also becoming more active. In some special applications and locations, like military for instance, radar is also a strong radiator that could be harvested. In some industrial settings, machinery and lighting are RF radiators that could sometimes be harvested.

Figure 4:
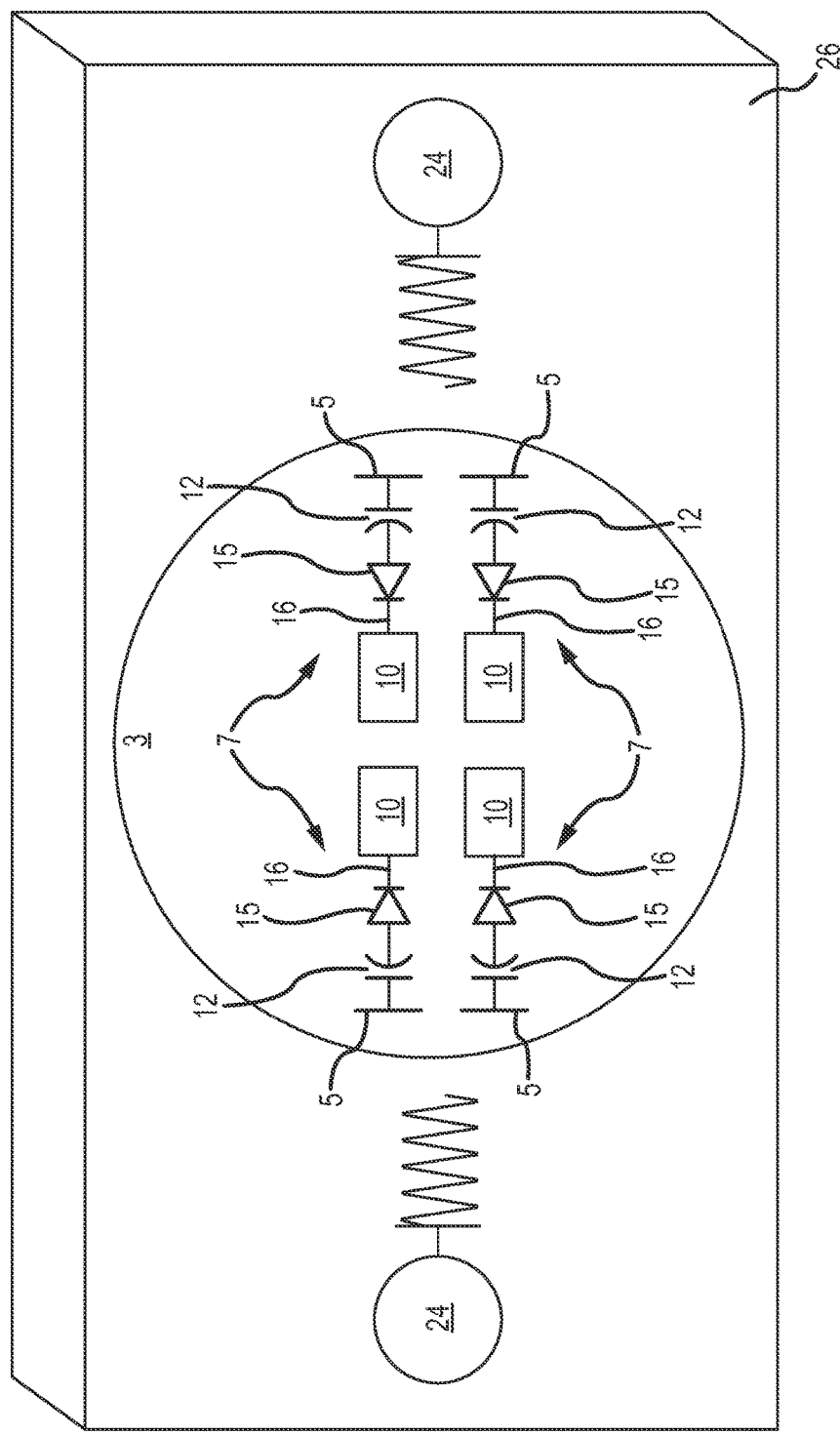
FIG. 4 depicts external oscillators that direct RF radiation at a worn garment in order to harvest additional DC power to increase the thermal regulation effect.

Referring now to FIG. 4, in addition to ambient RF, locally placed oscillators 24 radiating at selected frequencies corresponding to antennae within the thermal modules of a temperature regulating fabric, could transmit substantial amounts of RF energy for harvesting. In medical or veterinary treatment situations for instance, the 60 GHz unlicensed band could be quite effective; as such high frequencies do not propagate very far and do not penetrate walls. Where practical, like for a limb injury, the local oscillators 24 could be enclosed in a radio screen cage 26 that surrounds the garment, as conceptually illustrated in FIG. 4, so as to radiate high power without causing interference to other spectrum users nearby.

Examples of where such battery powered external local RF generators might be useful are to relieve thermal discomfort during electrical power grid outages, or when a central air conditioning unit is cycled off, or in transport or stabilization during trauma emergencies where a strong temperature altering effect could be critically important, possibly life saving. Moreover, a separate, dedicated small solar array (not shown) may be provided for DC power to charge batteries for night use and to drive the oscillators for energy harvesting where grid power limitations are present. Such grid power limitations may include: 1) restrictions imposed by regulatory authorities upon high energy consumption for air conditioning (the most demanding use of grid power) during peak demand times as a result of global warming effects; 2) imposition of increased rate scales upon heavy users of electricity; 3) grid outages resulting from insufficient output capacity; and 4) mandated rate increases for renewable for conservation purposes. A primary benefit of the unique and novel system of the instant invention is that in the case of cooling, relief may be realized without any additional cost for grid electricity, and indeed, a significant actual cost savings over the costs to operate conventional air-conditioning systems may be realized. In addition, in areas of the world having limited reliable grid power and in the European Union where central air conditioning is not common, the temperature control system of the present invention may be very effective.

Moreover, in earth-orbiting satellite and space station applications and during manned and unmanned space travel, very limited RF radiation would be available to harvest for DC power. Nonetheless, radiation at other wavelengths may be harvested by dedicated solar collectors and converted to DC to power external oscillators of the present invention. This local RF could then be antenna energy harvested for either cooling or warming of individuals and/or equipment.

RF radiation harvesting is also now being used to power sensors and their wireless transmissions within networks, called machine to machine (M2M), and in some elements of a smart grid for electrical power monitoring and controlled distribution, while near field inductive wireless recharging of batteries for cell phones and even electric vehicles is just now being offered as an alternative to hard wired plug in recharging. This speaks to the viability of RF energy harvesting as an entirely novel means to power the temperature regulating fabrics of the present invention.

Waste Heat Recovery:

Referring to FIG. 5, the efficiency of a thermal module 1 of the present invention may be enhanced by recycling heat from a warm outer surface, together with ambient air, to assist the TE device 10 on the cool skin side 30. As noted above, the TE device 10 moves heat from the side in contact with a user's skin to the outer side exposed to ambient air. By depositing a heat dissipation pad or heat sink layer 29 over the surface of the TE device 10 on the outer air side and operatively connecting it to a negative side 32 of a thermocouple 34 mounted on the substrate 3, the negative side would be warmed, thereby producing a DC current that may be coupled to the positive cool side 36 of the TE device 10, thus providing an additional source of DC power. Since the inclusion of a thermocouple occupies space on the flexible substrate 3 that could otherwise be occupied by additional RF antennae 5, the inclusion thereof in a fabric is a tradeoff that would be appropriate for certain cooling garments such as headbands and vests that are worn by workers in hot high ambient air temperature outdoor environments.

TE Terminology:

The sometimes confusing terminology regarding TE device technology is further clarified as follows. The positive DC anode power is applied to the cool layer. This is the side where the heat is collected or absorbed by conduction, otherwise referred to as a cool spreader. This collected heat is then propagated through the TE device layers to the DC cathode warm side. The outer layer on this cathode warm side can be referred to as a heat dissipation pad or heat sink; that is, it is the surface that transmits the heat away from the thermal module by convection to the ambient air. TE device technology is commonly employed to absorb excess heat in integrated circuit chips (on the cool side) to transfer it to the warm side to sink out of the package by convection via some pins or pads.

Applications:

In a garment designed using temperature regulatory fabrics to cool a wearer the body heat is collected from the skin and electrically driven through the TE device to be transferred or sinked, as the term is used in the art, through the pores of the outer fabric by convection to the ambient air. This heat transfer through a TE device is generally more effective when the ambient air temperature is lower than the skin temperature.

However in a garment designed using temperature regulatory fabrics to warm a wearer, heat is collected from the air and is propagated through the TE to the cathode warm side and transmitted by conduction onto the skin. This warming is useful when the wearer is feeling cold. More extreme examples for warming the skin are for a person suffering from frostbite on extremities or from general hyperthermia from immersion in icy water, among others.

The fabric itself may be formed from suitable washable, water-repellant, flexible, micro porous stretchable materials, including fabrics that contain heat conductive fibers in their weave. Micro porous fabrics are common in sports wear to wick moisture and to breathe, as is known in the art. The fabric layers are laminated together and cut or shaped to form snug, stretch fit garments such as caps, vests, jackets, socks, gloves, leg-wear and undergarments.

The individual thermal modules would be laid out on one of the fabric layers prior to lamination. Each independent module is retained in position by suitable retention means such as washable, water-resistant glues, adhesives, double-sided tape and/or stitching, among others.

It is anticipated that the temperature regulating fabrics could be shaped to wear against the skin as head caps, arm and leg sleeves, torso wraps, hand gloves, foot socks, among others. Some might be slip-on articles that stretch for positioning, while others might wrap and be held in place with snaps, zippers, ties or Velcro patches, among other possible connectors. Further, as discussed above, the temperature regulating fabrics may also be used in the manufacture of bedding such as sheets, pillow cases, and blankets and in the manufacture of seat cushions, seat back, seat pads and similar items designed for individual comfort.

Garments fabricated from temperature regulating fabrics that are primarily for cooling the skin include caps, arm and leg sleeves, shirts, vests, neck and torso wraps, among others. Garments that are primarily for warming the skin include socks, boot liners, gloves and hats, among others. Garments fabricated from temperature regulating fabrics that are primarily reversible for either cooling or warming the skin could include caps, sleeves and wraps, among others. The thermal efficiency of a TE device in the two directions is not symmetric, so the garment designs for cooling would differ from designs for warming only primarily by inverting the order of the TE layers as depicted in FIGS. 3(A)-(C), while appropriate tradeoffs would be considered for garments that could usefully be reversible. As an example, the outer fabric for a warming garment could be more insulating. Further, some fabrics could be selected that offer a preferred direction for heat transfer.

The temperature regulating fabrics of the present invention might be helpful for many applications such as in headwear for relief from hot flashes, night sweats, insomnia and migraines, cooled protective coverings for trauma injury management and post-operative temperature control, heat stress relief for athletes, the military, firefighters and construction and industrial workers, among others. Other applications include blankets and wraps which may be used in medical and/or veterinary applications such as leg wraps, blankets or other coverings for maintaining a safe internal body temperature for immobilized patients, agricultural livestock or recreational and sporting animals such as expensive race and show horses.

The unique temperature regulatory properties of the fabric of the present invention may also be applied in the manufacture of devices for food and beverage preservation such as wine chillers, lunch boxes and beverage container cooler and sleeves. These properties may also be used to construct low-level refrigeration devices for use in remote areas and in developing countries where electrical power distribution is limited or intermittent.

Changes may be made in the above methods, devices and structures without departing from the scope hereof. It should thus be noted that the matter contained in the above description and/or shown in the drawings should be interpreted as illustrative and not in a limiting sense. The following claims are intended to cover all generic and specific features described herein, as well as all statements of the scope of the present method, device and structure, which, as a matter of language, might be said to fall there between.

What is claimed is:

1. A temperature regulatory fabric comprising:
an inner micro porous fabric layer;
an outer micro porous fabric layer;
a plurality of independent thermal modules each incorporating a TE device and a plurality of antennae, each of the plurality of antennae having electronic elements operatively connected thereto, the electronic elements and each of the plurality of antennae being adapted to provide direct current (DC) power to a TE device by harvesting RF radiation;
each independent thermal module being positioned at a preselected location intermediate the inner and outer fabric layers, the inner and outer fabric layers being laminated to one another to form the temperature regulating fabric.

2. The temperature regulatory fabric of claim 1 wherein each independent thermal module includes a cool surface and a warm surface.

3. The temperature regulatory fabric of claim 2 wherein each independent thermal module is coated with a thermal insulating layer that covers the entire module except for the cool and the warm surfaces, the thermal insulating layer being structured and arranged to impede heat conducted by a TE device from flowing back through the fabric to a source of the heat.

4. The temperature regulatory fabric of claim 3 wherein each independent thermal module is coated with a heat conductive spreading layer on the cool surface.

5. The temperature regulatory fabric of claim 3 wherein each independent thermal module is coated with a heat conductive spreading layer on the warm surface.

6. The temperature regulatory fabric of claim 3 wherein each independent thermal module is coated with a heat conductive spreading layer on both the cool and the warm surfaces.

7. The temperature regulatory fabric of claim 1 further including at least one thermocouple operatively connected to at least one of the plurality of thermal modules laminated within the fabric, the at least one thermocouple being structured and arranged to convert ambient air heat and heat from a warm surface of the at least one thermal module into DC power.

8. The temperature regulatory fabric of claim 1 wherein each of the plurality of independent thermal modules are formed on a flexible substrate.

9. The temperature regulatory fabric of claim 8 wherein the flexible substrate is laminated intermediate the inner and outer micro porous fabric layers.

10. The temperature regulatory fabric of claim 9 further including means for operatively connecting the flexible substrate to the inner and an outer micro porous fabric layers.

11. The temperature regulatory fabric of claim 10 wherein the means for operatively connecting comprises water resistant adhesive.

12. The temperature regulatory fabric of claim 1 wherein the fabric is reversible in order to transfer heat in the opposite direction.

13. The temperature regulatory fabric of claim 1 wherein the radiation being harvested is in the form of cellular communications radiation.

14. The temperature regulatory fabric of claim 1 wherein the radiation being harvested is in the form of Wi-Fi communications radiation.

15. The temperature regulatory fabric of claim 1 wherein the radiation being harvested is partially supplied by a plurality of oscillators transmitting radiation at frequencies corresponding to at least one antenna within the thermal module.

16. The temperature regulatory fabric of claim 15 wherein each of the plurality of oscillators are enclosed in a radio screen cage that surrounds the temperature regulating fabric so as to not cause RF interference to other nearby spectrum uses.

17. A temperature regulating apparatus comprising:
a temperature regulatory fabric, the fabric including
an inner micro porous fabric layer;
an outer micro porous fabric layer;
a plurality of independent thermal modules each incorporating a TE device and a plurality of antennae, each of the plurality of antennae having electronic elements operatively connected thereto, the electronic elements and each of the plurality of antenna being adapted to provide direct current (DC) power to a TE device by harvesting RF radiation;
each independent thermal module being positioned at a preselected location intermediate the inner and outer fabric layers, the inner and outer fabric layers being laminated to one another to form the temperature regulating fabric.

18. The temperature regulating apparatus of claim 17 wherein the apparatus comprises a wearable garment.

19. The temperature regulating apparatus of claim 18 wherein the plurality of thermal modules are structured and arranged to cool a wearer of the garment, the wearer having a skin, by conducting heat from the wearer's skin through the TE device whereupon it is dissipated by convection through the outer micro porous fabric layer to the ambient air.

20. The temperature regulating apparatus of claim 18 wherein the plurality of thermal modules are structured and arranged to warm a wearer of the garment, the wearer having a skin, by absorbing heat delivered by convection from the ambient air through the outer micro porous fabric layer and the TE device for transfer through the inner micro porous fabric layer to the wearer's skin.

21. A temperature regulatory fabric comprising:
an inner micro porous fabric layer;
an outer micro porous fabric layer;
a plurality of flexible substrate members disposed at preselected locations intermediate the inner and outer micro porous fabric layers;
a plurality of independent thermal modules aligned on and operatively connected to each of the plurality of flexible substrate members, each of the plurality of independent thermal modules including a TE device and a plurality of antennae, each of the plurality of antennae having electronic elements operatively connected thereto, the antennae and associated electronic elements each being structured and arranged to harvest alternating current (AC) RF radiation waveforms and to convert the harvested RF radiation waveforms to direct current (DC) to power the TE device; the inner micro porous fabric layer, the outer micro porous fabric layer and the plurality of flexible substrate members being laminated to one another to form the temperature regulatory fabric.

22. The temperature regulatory fabric of claim 21 further including a heat transfer opening formed in the flexible substrate members beneath each of the plurality of TE devices.

23. The temperature regulatory fabric of claim 22 wherein the electronic elements operatively connected to each of the plurality of antenna include a capacitor and a diode.

24. The temperature regulatory fabric of claim 23 wherein each of the plurality of capacitors has a specific capacitor value and each of the plurality of antennae has a length and a shape, the antennae and electronic elements operatively connected thereto being selectively tunable to receive and to process different RF radiation bands by changing antenna length and/or shape and/or the capacitor value.

25. The temperature regulatory fabric of claim 24 wherein the DC outputs of each of the plurality of antennae operatively connected to each TE device are additive.

26. The temperature regulatory fabric of claim 25 wherein each independent thermal module includes a cool surface and a warm surface.

27. The temperature regulatory fabric of claim 26 wherein each independent thermal module is coated with a thermal insulating layer that covers the entire module except for the cool and the warm surfaces, the thermal insulating layer being structured and arranged to impede heat conducted by a TE device from flowing back through the fabric to a source of the heat.

28. The temperature regulatory fabric of claim 27 wherein each independent thermal module is coated with a heat conductive spreading layer on the cool surface.

29. The temperature regulatory fabric of claim 27 wherein each independent thermal module is coated with a heat conductive spreading layer on the warm surface.

30. The temperature regulatory fabric of claim 27 wherein each independent thermal module is coated with a heat conductive spreading layer on both the cool and the warm surfaces.

31. The temperature regulatory fabric of claim 21 further including at least one thermocouple operatively connected to at least one of the plurality of thermal modules laminated within the fabric, the at least one thermocouple being structured and arranged to convert ambient air heat and heat from a warm surface of the at least one thermal module into DC power.

32. The temperature regulatory fabric of claim 21 further including a water-resistant adhesive applied to each of the plurality of independent thermal modules whereby each of the thermal modules is retained in position.

33. The temperature regulatory fabric of claim 21 further including at least one oscillator adapted to transmit RF energy at a frequency which corresponds to a frequency that at least one of the plurality of antennae may receive.

34. The temperature regulating apparatus of claim 21 wherein the apparatus comprises a wearable garment.

35. The temperature regulating apparatus of claim 34 wherein the plurality of thermal modules are structured and arranged to cool a wearer of the garment, the wearer having a skin, by conducting heat from the wearer's skin through the TE device whereupon it is dissipated by convection through the outer micro porous fabric layer to the ambient air.

36. The temperature regulating apparatus of claim 34 wherein the plurality of thermal modules are structured and arranged to warm a wearer of the garment, the wearer having a skin, by absorbing heat delivered by convection from the ambient air through the outer micro porous fabric layer and the TE device for transfer through the inner micro porous fabric layer to the wearer's skin.

\* \* \* \* \*